United States Patent [19]

Yoneda

[11] Patent Number: 5,277,740
[45] Date of Patent: Jan. 11, 1994

[54] APPARATUS AND METHOD FOR FORMING A FINE PATTERN

[75] Inventor: Masahiro Yoneda, Itami, Japan

[73] Assignee: Mitsubishi Denki Kabushiki Kaisha, Tokyo, Japan

[21] Appl. No.: 887,588

[22] Filed: May 20, 1992

Related U.S. Application Data

[63] Continuation of Ser. No. 630,054, Dec. 19, 1990, abandoned.

[30] Foreign Application Priority Data

Aug. 31, 1990 [JP] Japan .................................. 2-228018

[51] Int. Cl.$^5$ ............................................. H01L 21/00
[52] U.S. Cl. ...................................... 156/345; 156/643; 118/723 E; 204/298.31; 204/298.02
[58] Field of Search ................. 156/345, 643; 118/723, 118/715; 204/298.31, 298.34, 298.02, 298.06

[56] References Cited

FOREIGN PATENT DOCUMENTS

| | | |
|---|---|---|
| 3900768 | 2/1990 | Fed. Rep. of Germany . |
| 59-004025 | 1/1984 | Japan . |
| 63-072110 | 4/1988 | Japan . |
| 63-099531 | 4/1988 | Japan . |
| 63-149368 | 6/1988 | Japan . |
| 63-153265 | 6/1988 | Japan . |
| 63-290270 | 11/1988 | Japan . |
| 1-62461 | 3/1989 | Japan . |
| 1-111333 | 4/1989 | Japan . |
| 1-298169 | 12/1989 | Japan . |

OTHER PUBLICATIONS

Shwartzman et al. "Megasonic Particle Removal From Solid-State Wafers", RCA Review, vol. 46, Mar. 1985, pp. 81-105.

*Primary Examiner*—Brian E. Hearn
*Assistant Examiner*—George Goudreau
*Attorney, Agent, or Firm*—Leydig, Voit & Mayer

[57] ABSTRACT

A fine pattern forming apparatus includes an elastic wave generating device which is provided on the wall of a vacuum chamber. A fine pattern forming method involves formation of a fine pattern while an elastic wave is being applied to the vacuum chamber by the elastic wave generating device. Since the fine pattern is formed while the elastic wave is applied to the vacuum chamber the, uniformity of the plasma density and of the electron density is improved and attachment of reaction products to the vacuum chamber is prevented.

17 Claims, 4 Drawing Sheets

APPARATUS AND METHOD FOR FORMING A FINE PATTERN

This application is a continuation of application Ser. No. 07/630,054, filed Dec. 19, 1990, now abandoned.

BACKGROUND OF THE INVENTION

1. Field of the Invention

The present invention relates to a method and apparatus for fine pattern forming. Particularly, the present invention pertains to a fine pattern forming apparatus for forming a fine pattern formation while applying an elastic wave to a vacuum chamber.

2. Description of Related Art

FIG. 1 is a schematic cross-sectional view of a conventional fine pattern forming apparatus, e.g., a plasma etching apparatus. In this apparatus, a semiconductor substrate 2, in which a fine pattern is formed, is disposed within a vacuum chamber 1. The semiconductor substrate 2 has on its surface, for example, thin polycrystalline silicon film and a photoresist pattern mask which resists etching. In the vacuum chamber 1, the semiconductor substrate 2 is placed on a sample stage 4 which also serves as an electrode connected to a high-frequency power source 3 for supplying high-frequency power (hereinafter referred to simply as "an electrode 4"). An electrode 6 with gas nozzles 5 provided therein to uniformly supply an etching, i.e., reactive gas, e.g., chlorine gas, toward the semiconductor substrate 2 is disposed in opposed relation to the semiconductor substrate 2. The vacuum chamber 1 is provided with an evacuation port 7 through which the vacuum chamber 1 is evacuated and a reactive gas supply port 8 through which the etching gas is supplied into the vacuum chamber 1.

The thus-arranged conventional fine pattern forming apparatus will be operated in the manner described below. First, an etching gas is introduced into the interior of the vacuum chamber 1 from the reactive gas supply port 8 through the gas nozzles while the vacuum chamber 1 is evacuated from the evacuation port 7 by an evacuation means (not shown). Next, a high-frequency voltage is applied between the electrode 4 and the opposed electrode 6 by the high-frequency power source 3 to generate a glow discharge. In consequence, the etching gas introduced into the vacuum chamber 1 is activated and thereby becomes a plasma, generating active neutral molecules, neutral atoms and ions. Etching of the semiconductor substrate 2 progresses due to the presence of these molecules, atoms and ions, and a fine pattern is thus formed.

The above conventional fine pattern forming techniques has the following drawbacks.

(1) Uniformity of the etch rate

In the conventional techniques, since spatial distribution of the activated halogen gas or halogen ions occurs, when a fine pattern is to be formed on a sample having a large diameter, variation in the etch rate in the plane of the substrate occurs. A reduction in the etch rate requires a large etching chamber.

(2) Etching selectivity with respect to a base film

In the conventional techniques, an etchant such as charged particles is irradiated onto the sample in an accelerated state. In consequence, the etched surface is damaged and sufficient selectivity with respect to the base etching preventing film cannot be obtained.

(3) Reduction in the etch rate for a fine pattern due to the microloading effect In the conventional techniques, since the directional property of an etchant is not satisfactory, the amount of etchant reaching a gap in a fine pattern is reduced, decreasing the etch rate. Furthermore, the degree at which a reaction product attaches to the side wall of a pattern formed during the etching depends on the pattern size. Dependence of anisotropic etching profile on the pattern size must be reduced.

(4) The above-described problems of the conventional techniques harm the characteristics of the active devices formed by the fine patterning.

SUMMARY OF THE INVENTION

The present invention is directed to eliminating the aforementioned problems of the conventional fine pattern forming techniques and has an object of providing a fine pattern forming apparatus which assures a uniform plasma density, a uniform electron density, an increase in the etch rate, limits the attachment reaction products to the vacuum chamber and limits charging up of a sample due to an improvement in the uniformity of the electron density, as well as a method of forming such a fine pattern.

To this end, according to one aspect of the present invention, there is provided a fine pattern forming apparatus which comprises: a vacuum chamber; reactive gas supplying means for supplying a reactive gas into the vacuum chamber; plasma generating means for generating a plasma in the reactive gas within the vacuum chamber; a sample stage serving as an electrode disposed within the vacuum chamber for placing a sample thereon and being connected to the plasma generating means; elastic wave generating means provided on a wall of the vacuum chamber; and evacuation means for evacuating the interior of the vacuum chamber.

According to another aspect of the present invention, there is provided a fine pattern forming method which comprises the steps of: placing a sample in which a fine pattern is formed on a sample stage serving as an electrode disposed in a vacuum chamber; evacuating the interior of the vacuum chamber to a predetermined degree of vacuum; supplying a reactive gas into the vacuum chamber; generating a plasma in the reactive gas within the vacuum chamber with the sample stage and plasma generating means; and forming a fine pattern while applying an elastic wave to the vacuum chamber from an elastic wave generation means provided on the wall of the vacuum chamber.

DESCRIPTION OF THE PREFERRED EMBODIMENTS

Figure 1:
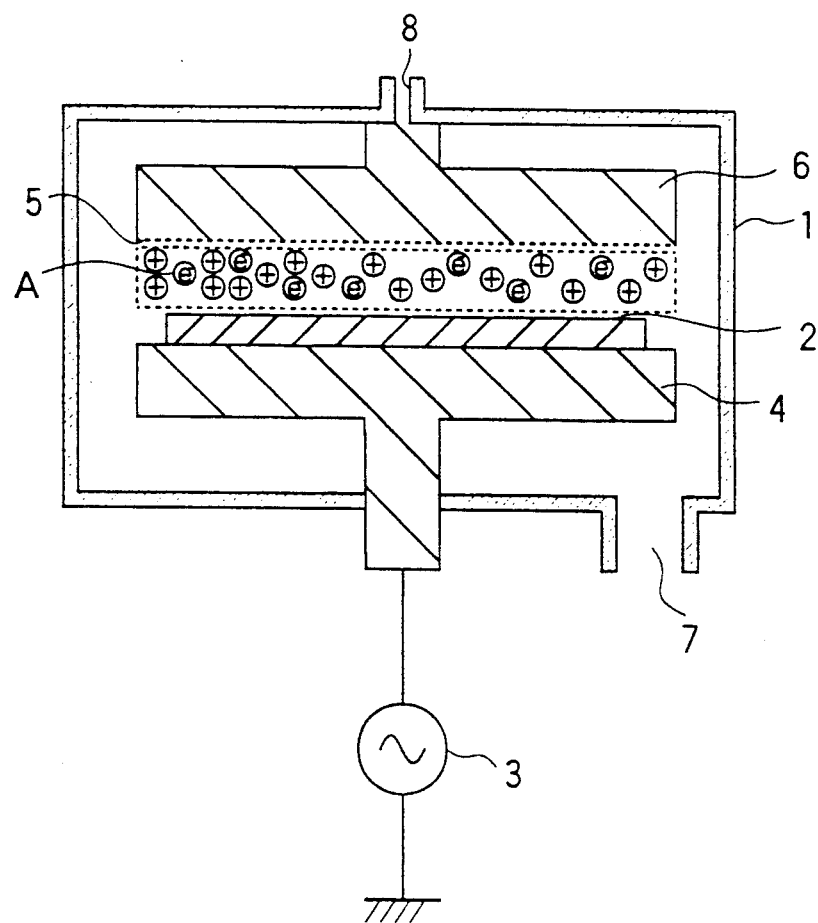
FIG. 1 is a schematic cross-sectional view of a conventional plasma etching apparatus.

Techniques of forming a fine pattern on a substrate by utilizing a high-frequency wave, microwaves, light energy and an energy beam have been known. However, a fine pattern forming technique which utilizes an elastic wave is not known. The present invention involves a fine pattern formation which employs an elastic wave.

The fine pattern forming apparatus and method thereof according to the present invention utilize the following effects of the elastic wave on a substance.

[1] Heating of a substance by the elastic wave

It is known that elastic waves interact with a medium in the process of propagation and are thereby attenuated. The energy of the waves which is lost by the attenuation becomes heat energy and the medium is therefore heated to raise the temperature thereof. When the attenuation coefficient is the same, the larger the amplitude of the wave, the more energy is lost per unit volume by the attenuation of the wave. In particular, when a resonant structure exists, a standing wave whose amplitude is sufficiently large is generated in that structure, causing great local energy loss. This makes local heating possible.

Heating of a workpiece to be processed improves the fine pattern formation in the manner described below. Generally, (1) it increases the speed at which a fine pattern is formed due to acceleration of a thermal reaction. (2) It improves etching selectivity due to a difference in the chemical reaction caused by the local heating. (3) It facilitates entry of an etchant deep into the interior of a fine pattern and thereby improves the fine patterning performance.

[2] Displacement of a substance by the elastic wave

An elastic wave is propagated by a medium in which displaced particles of the medium transfer momentum to adjoining particles, and are themselves restored to their original position. Hence, existence of the elastic wave is synonymous with existence of displacement of a substance. When an elastic wave is generated in a substance which contributes to the etching, the area of the surface of the substance which is small as compared with the waveform is displaced periodically in a direction perpendicular or tangential to the surface which is dependent on the direction of propagation of the wave and the angle between a varying vector and a wave component vector.

Such a displacement improves the fine pattern forming characteristics in the manner described below. When the speed at which the area is displaced by the elastic wave is great as compared with the speed of incident the, relative speed of the incident particles increases, thereby increasing the momentum of the incident particles. In consequence, (1) the speed at which the fine pattern is formed increases. (2) The pattern to be formed is improved due to the improved directional property of the incident particles. (3) The fine pattern formation is improved due to facilitation of entry of an etchant into the interior of a fine pattern. (4) Etching of an area in a shoulder whose absolute thickness is large is improved. (5) Peel off of a reaction product is accelerated due to vibrations caused by the elastic wave.

[3] Condensation of a substance by the elastic wave

Since only fine particles are displaced by the elastic wave and the collision thereof therefore increases, agglomeration and dissociation of an etchant in the plasma are accelerated. This improves the fine pattern forming characteristics in the manner described below. (1) The speed at which a fine pattern is formed increases due to an increase in the density of the etchant. (2) Since the type of etchant can be varied due to the dissociation not caused by the normal discharge, selective fine pattern formation is made possible.

Figure 2:
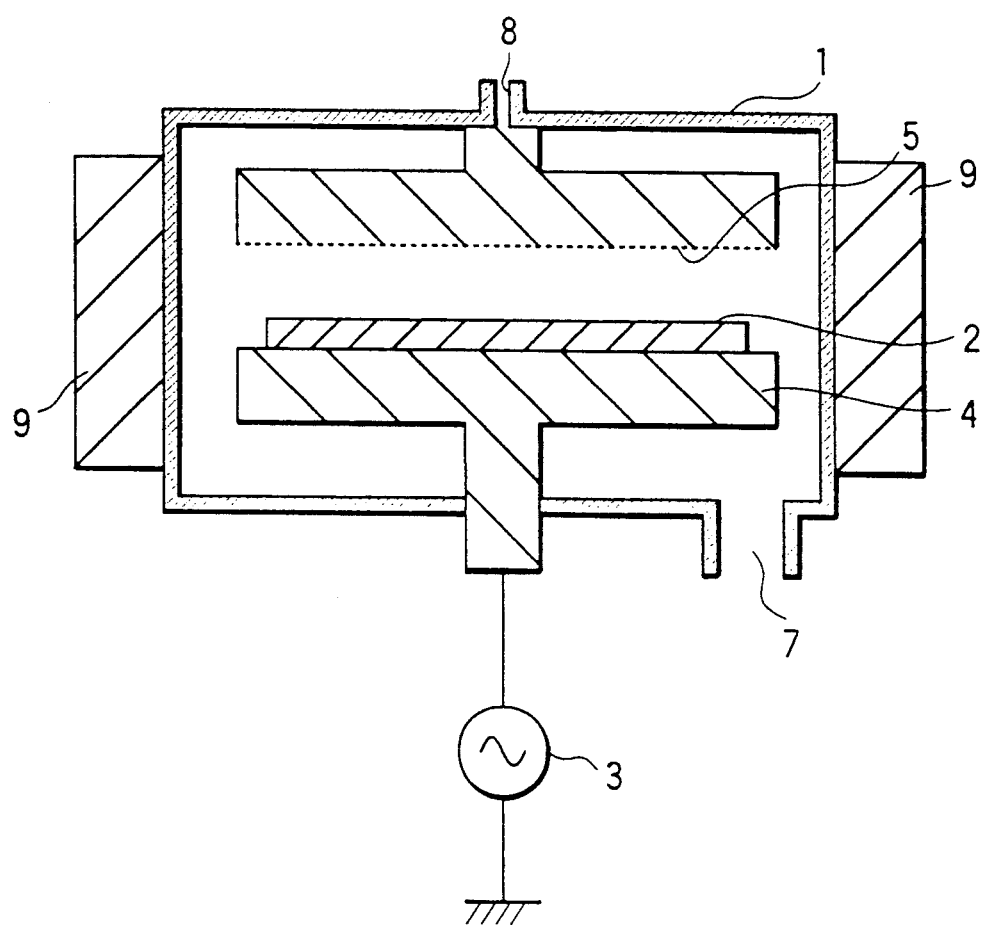
FIG. 2 is a schematic cross-sectional view of an embodiment of a plasma etching apparatus according to the present invention.

Next, an embodiment of the present invention will be described with reference to FIGS. 2 to 4. FIG. 2 is a schematic view of an embodiment of a fine pattern forming apparatus, e.g., a plasma etching apparatus, according to the present invention. In FIG. 2, reference numerals 1 to 8 respectively denote parts which are the same as those in the conventional fine pattern forming apparatus shown in FIG. 1. This embodiment employs as an elastic wave generation means 9 an ultrasonic wave generation source for generating an elastic wave having a frequency of 10 kHz or above, i.e., a wave with a so-called ultrasonic wave area. That is, the ultrasonic wave generation means, which may be a piezoelectric vibrator, an electrostrictive vibrator or a magnetostrictive vibrator, is disposed on a wall of the vacuum chamber 1.

Figure 3:
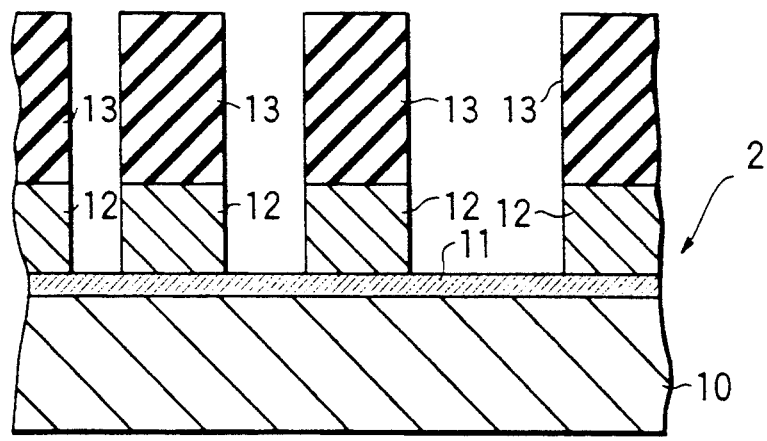
FIG. 3 is a side cross-sectional view of a semiconductor substrate on which etching is conducted in the apparatus shown in FIG. 2.

FIG. 3 is a cross-sectional view of a semiconductor substrate which is obtained when a polycrystalline silicon film formed on the semiconductor substrate is etched by the plasma etching apparatus shown in FIG. 2. In FIG. 3, a silicon oxide film 11 is formed on a substrate 10 of the semiconductor substrate 2, and a polycrystalline silicon film 12 to be processed is formed on the silicon oxide film 11. A patterned photoresist film 13 is formed on the polycrystal silicon film 12 by a photolithographic process as a mask which resists etching.

In the fine pattern forming method which employs the above-described fine pattern forming apparatus, the semiconductor substrate 2 is placed on the electrode 4 first. Next, an etching gas which is a reactive gas is introduced into the vacuum chamber 1 from the gas nozzles 5 while the vacuum chamber 1 is evacuated from the evacuation port 7. A high-frequency voltage is applied between the electrode 4 and the electrode 6 by the high-frequency power source 3 to generate a glow discharge. In consequence, the etching gas introduced into the vacuum chamber 1 is activated and thereby becomes a plasma, generating active neutral molecules, neutral atoms and ions. Etching of the semiconductor substrate 2 progresses due to the presence of these molecules, atoms and ions, and a fine pattern is thus formed.

At that time, an ultrasonic waves are generated by the ultrasonic wave generating source and applied to the vacuum chamber, whereby the wall of the vacuum chamber 1 is excited by the ultrasonic waves. In consequence, the reaction products and electrons which reach the wall of the vacuum chamber 1 possess a larger momentum than when no ultrasonic waves are applied. Due to the above-described effects of the elastic waves, including heating, displacement and condensation of a substance, the reaction products and electrons remain activated even when they collide against the wall surface of the vacuum chamber. As a result the, uniformity of the plasma density improves, and attachment of the reaction products to the wall is prevented.

Figure 4:
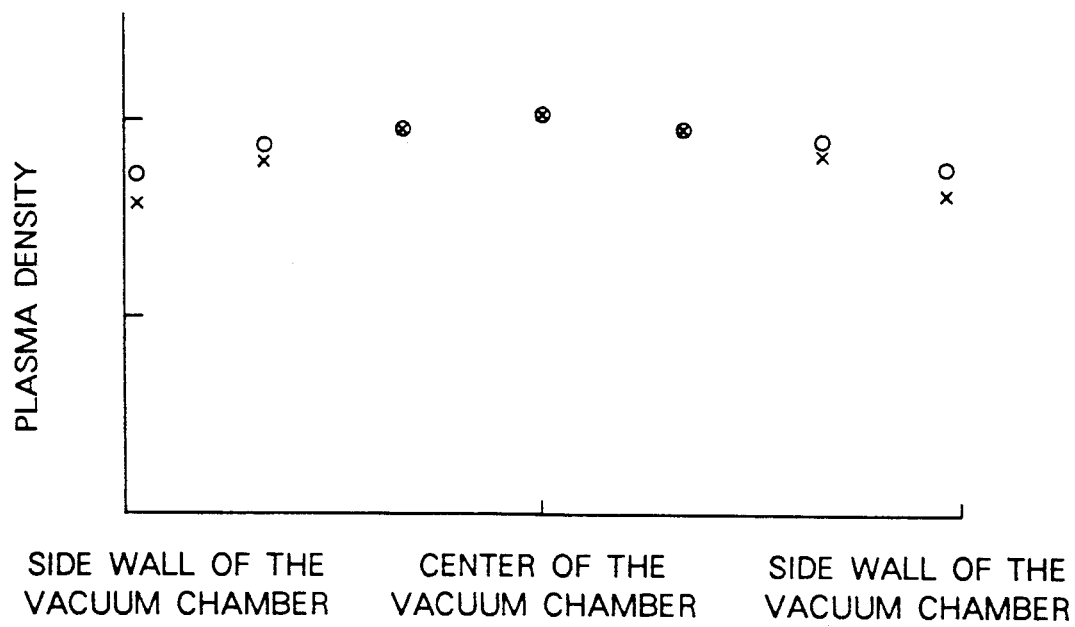
FIG. 4 is a graph showing the distribution of the plasma density in an embodiment of the present invention and in the conventional plasma etching apparatus.

FIG. 4 is a graph showing distribution of a plasma density obtained in the embodiment of the present invention and in the conventional plasma etching apparatus. As can be seen from the graph, uniformity of the plasma density and of the electron density is improved in the case where the vacuum chamber 1 is excited by the ultrasonic waves (indicated by o in FIG. 4) as compared with the case where no ultrasonic waves are supplied (indicated by 'x' in FIG. 4). Hence, charging of the semiconductor substrate 2 is limited due to the improvement in the etch rate and in the uniformity of the electron density.

The above-described embodiment employs as the fine pattern forming method the plasma etching process. However, the present invention is also applicable to the reactive ion etching process, a magnetic field supported reactive ion etching process, the electron cyclotron plasma etching process, a neutral beam etching process, a light excited etching process, a light supported etching process or a physical ion etching process.

The silicon oxide film 11 is used as the film in which a fine pattern is formed. However, a silicon nitride film or a silicon oxynitride film may also be used. A single crystal silicon film may be used in place of the polycrystalline silicon film 12.

The film in which a fine pattern is formed may be made of tungsten, tantalum, molybdenum, zirconium, titanium, hafnium, chromium, platinum, iron, zinc, tin, a silicide of any of these substances, a nitride of any of these substances or a carbide of any of these substances; aluminum, copper, gold, silver or an alloy which is mainly composed of any of these metals; or an organic polymer such as a novolak resin or polyimide.

The film in which a fine pattern is formed may be a ferroelectric material such as PZT, (lead, zinc, tin), a superconductor including an oxide superconductor or a ferromagnetic material.

The above embodiment employs as a sample, i.e. a substance, to be processed, the thin film formed on the semiconductor substrate 2 which is used in the semiconductor integrated circuit manufacturing process. However, the present invention is also applicable to a substrate of a magnetic tape or of a magnetic disk employed in a magnetic storage apparatus which is subjected to a storage device forming process, a substrate for an optical disk or the like employed in an optical storage apparatus which is subjected to a storage device forming process, a shaped metal substance, a thin film formed on the surface of the shaped metal substance, a machine component such as a screw or a machining tool.

As will be understood from the foregoing description, in the fine pattern forming apparatus and the method according to the present invention, since the fine pattern formation is conducted while an elastic wave is being applied to the vacuum chamber the, uniformity of the plasma density and of the electron density are improved, the etch rate is improved, attachment of reaction products to the vacuum chamber is limited and charging of the sample is limited due to the improvement in the uniformity of the electron density.

What is claimed is:

1. A fine pattern forming apparatus comprising:
   a vacuum chamber defined by and inside a wall; p1 reactive gas supplying means for generating a plasma in a reactive gas within said vacuum chamber;
   a sample stage electrode disposed within said vacuum chamber for supporting a sample and connected to said plasma generating means;
   a second electrode disposed within said vacuum chamber opposed to said sample stage electrode and connected to said plasma generating means;
   elastic wave generating means for generating ultrasonic waves, said elastic wave generating means being disposed on the wall of and outside said vacuum chamber transverse to said sample stage electrode, said second electrode, and a sample disposed on said sample stage electrode whereby uniformity of the plasma in said vacuum chamber across a sample disposed on said sample stage electrode is improved by the ultrasonic wages generated by said elastic wave generating means; and
   evacuation means for evacuating said vacuum chamber.

2. A fine pattern forming apparatus according to claim 1 wherein an elastic wave generating means generates ultrasonic waves having a frequency of 10 KHz or above.

3. A fine pattern forming apparatus according to claim 1 wherein said sample is a semiconductor substrate.

4. A fine pattern forming apparatus according to claim 1 wherein said sample is a magnetic tape.

5. A fine pattern forming apparatus according to claim 1 wherein said sample is a magnetic disk.

6. A fine pattern forming apparatus according to claim 1 wherein said sample is an optical disk.

7. A fine pattern forming apparatus according to claim 1 wherein said sample is a shaped metal substance.

8. A fine pattern forming apparatus according to claim 1 wherein said sample is a machine component.

9. A fine pattern forming apparatus according to claim 1 wherein said sample is a substrate on which a film in which a fine pattern is to be formed in disposed.

10. A fine pattern forming apparatus according to claim 9 wherein said film in which a fine pattern is to be formed is selected from the group consisting of silicon oxide, silicon nitride, and silicon oxynitride.

11. A fine pattern forming apparatus according to claim 9 wherein said film in which a fine pattern is to be formed is selected from the group consisting of polycrystalline and single crystal silicon films.

12. A fine pattern forming apparatus according to claim 9 wherein said film in which a fine pattern is to be formed is selected from the group consisting of tungsten, tantalum, molybdenum, zirconium, titanium, hafnium, chromium, platinum, iron, zinc, tin, silicides of any of the foregoing elements, nitrides of any of the foregoing elements, and carbides of any of the foregoing elements.

13. A fine pattern forming apparatus according to claim 9 wherein said film in which a fine pattern is to be formed is selected from the group consisting of aluminum, copper, gold, silver, and alloys composed mainly of any of these metals.

14. A fine pattern forming apparatus according to claim 9 wherein said film in which a fine pattern is to be formed is an organic polymer such as a novolak resin and a polyimide.

15. A fine pattern forming apparatus according to claim 9 wherein said film in which a fine pattern is to be formed is a ferroelectric substance such as PZT (lead, zinc, tin).

16. A fine pattern forming apparatus according to claim 9 wherein said film in which a fine pattern is to be formed is a superconductor including an oxide superconductor.

17. A fine pattern forming apparatus according to claim 9 wherein said film in which a fine pattern is to be formed is a ferromagnetic substance.

* * * * *

UNITED STATES PATENT AND TRADEMARK OFFICE
CERTIFICATE OF CORRECTION

PATENT NO. : 5,277,740
DATED : January 11, 1994
INVENTOR(S) : Masahiro Yoneda

It is certified that error appears in the above-indentified patent and that said Letters Patent is hereby corrected as shown below:

On the Title Page;
Item [57], line 8, change "chamber the, uniformity" to --chamber, the uniformity--.

Col. 6, line 5, change "wages" to --waves--.

Signed and Sealed this

Twelfth Day of July, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,277,740
DATED : January 11, 1994
INVENTOR(S) : Masahiro Yoneda

It is certified that error appears in the above-indentified patent and that said Letters Patent is hereby corrected as shown below:

Column 5, line 53, delete "p1".

Signed and Sealed this

Twenty-first Day of February, 1995

Attest:

BRUCE LEHMAN

Attesting Officer     Commissioner of Patents and Trademarks